(12) United States Patent
Liu et al.

(10) Patent No.: US 11,262,140 B2
(45) Date of Patent: Mar. 1, 2022

(54) HEAT SINK AND HOUSING ASSEMBLY

(71) Applicants: Tyco Electronics (Shanghai) Co. Ltd., Shanghai (CN); Tyco Electronics AMP Guangdong Ltd, Foshan (CN)

(72) Inventors: WenYu Liu, Shanghai (CN); Hongqiang Han, Shanghai (CN); Jinsheng Lai, Foshan (CN); Yan Lee, Shanghai (CN); Lei Liu, Shanghai (CN)

(73) Assignees: Tyco Electronics (Shanghai) Co. Ltd., Shanghai (CN); Tyco Electronics AMP Guangdong Ltd., Foshan (CN)

( * ) Notice: Subject to any disclaimer, the term of this patent is extended or adjusted under 35 U.S.C. 154(b) by 140 days.

(21) Appl. No.: 16/587,880

(22) Filed: Sep. 30, 2019

(65) Prior Publication Data

US 2020/0103181 A1    Apr. 2, 2020

(30) Foreign Application Priority Data

Sep. 30, 2018  (CN) .......................... 201811165757.0

(51) Int. Cl.
| | |
|---|---|
| *F28F 3/04* | (2006.01) |
| *H01R 13/46* | (2006.01) |
| *H01R 12/58* | (2011.01) |
| *H01R 13/6581* | (2011.01) |

(52) U.S. Cl.
CPC .............. *F28F 3/04* (2013.01); *H01R 12/58* (2013.01); *H01R 13/46* (2013.01); *H01R 13/6581* (2013.01); *F28F 2280/00* (2013.01)

(58) Field of Classification Search
CPC ...... F28D 2021/0028; F28D 2021/0029; F28F 3/06; F28F 2280/00; H05K 7/20; H05K 7/2039; H05K 7/20418; H05K 7/20445; H05K 7/20472; H05K 7/2049; H05K 7/20509; H05K 7/20854; H05K 7/209; H01L 21/4878; H01L 21/4882; H01L 23/36; H01L 23/3672; H01L 23/40; H01L 2023/4062; H01L 23/4093
See application file for complete search history.

(56) References Cited

U.S. PATENT DOCUMENTS

| | | | | | |
|---|---|---|---|---|---|
| 5,777,259 | A | * | 7/1998 | Mennucci ........... | H01L 23/3672 165/185 |
| 5,953,212 | A | * | 9/1999 | Lee ..................... | H01L 23/4093 361/709 |
| 5,969,949 | A | * | 10/1999 | Kim .................... | H01L 23/4006 165/185 |
| 6,082,443 | A | * | 7/2000 | Yamamoto .......... | F28D 15/0233 165/104.21 |
| 6,089,315 | A | * | 7/2000 | Lee ..................... | H01L 23/3675 165/185 |

(Continued)

*Primary Examiner* — Jianying C Atkisson
*Assistant Examiner* — Jose O Class-Quinones
(74) *Attorney, Agent, or Firm* — Barley Snyder (57) ABSTRACT

A heat sink includes a heat sink body having a plurality of stacked fins and a mounting base including a heat dissipation plate. A first surface of the heat dissipation plate is connected to a lower portion of the heat sink body. A protrusion protruding away from the heat sink body is disposed on a portion of a second surface of the heat dissipation plate opposite to the first surface. The protrusion is formed by stamping or bending the heat dissipation plate away from the heat sink body from the first surface of the heat dissipation plate.

20 Claims, 8 Drawing Sheets

(56) References Cited

U.S. PATENT DOCUMENTS

| | | | | |
|---|---|---|---|---|
| 6,301,779 B1* | 10/2001 | Azar | ...................... | B23P 15/26 |
| | | | | 165/80.3 |
| 6,401,810 B1* | 6/2002 | Kuo | ........................ | F28F 3/02 |
| | | | | 165/185 |
| 6,607,028 B1* | 8/2003 | Wang | ........................ | F28F 3/02 |
| | | | | 165/185 |
| 6,749,448 B2* | 6/2004 | Bright | .................. | G02B 6/4201 |
| | | | | 439/160 |
| 6,765,799 B1* | 7/2004 | Huang | ................ | H01L 23/3672 |
| | | | | 165/185 |
| 6,816,376 B2 | 11/2004 | Bright et al. | | |
| 6,966,361 B2* | 11/2005 | Connors | ............. | F28D 15/0233 |
| | | | | 165/104.33 |
| 6,980,437 B2 | 12/2005 | Bright | | |
| 7,070,446 B2 | 7/2006 | Henry et al. | | |
| 7,355,857 B2* | 4/2008 | Pirillis | ................. | H05K 9/0058 |
| | | | | 361/715 |
| 8,051,896 B2* | 11/2011 | Wayman | ............... | H01L 23/373 |
| | | | | 165/80.3 |
| 8,345,445 B2* | 1/2013 | Del Prete | .................. | G06F 1/20 |
| | | | | 361/804 |
| 8,449,331 B2* | 5/2013 | Phillips | ............. | H01R 13/6581 |
| | | | | 439/607.21 |
| 8,535,787 B1* | 9/2013 | Lima | ..................... | B32B 27/281 |
| | | | | 428/195.1 |
| 8,857,502 B2* | 10/2014 | Huang | ................ | F28D 15/0233 |
| | | | | 165/104.26 |
| 8,879,267 B2* | 11/2014 | Henry | ................. | H04L 12/6418 |
| | | | | 361/715 |
| 8,885,342 B2* | 11/2014 | Skepnek | ............... | H01L 23/433 |
| | | | | 361/709 |
| 9,137,928 B2* | 9/2015 | Chen | .................. | H05K 7/2039 |
| 9,696,506 B2* | 7/2017 | Wu | ...................... | G02B 6/4269 |
| 9,939,858 B2* | 4/2018 | Lin | ........................ | G06F 1/203 |
| 9,980,411 B2* | 5/2018 | Yang | ................. | H05K 7/20418 |
| 10,069,248 B2* | 9/2018 | Su | ...................... | H01R 13/6583 |
| 2001/0001416 A1* | 5/2001 | Lee | ..................... | H01L 23/3672 |
| | | | | 165/80.3 |
| 2002/0024797 A1* | 2/2002 | Chen | .................. | H01L 23/3672 |
| | | | | 361/704 |
| 2003/0184969 A1* | 10/2003 | Itabashi | ............. | H01L 23/3677 |
| | | | | 361/688 |
| 2003/0184981 A1* | 10/2003 | Daniels | ............. | H05K 7/20445 |
| | | | | 361/752 |
| 2004/0027816 A1* | 2/2004 | Ice | ....................... | G02B 6/4201 |
| | | | | 361/797 |
| 2004/0084764 A1* | 5/2004 | Ishimine | ............. | H01L 23/4006 |
| | | | | 257/706 |
| 2004/0238946 A1* | 12/2004 | Tachibana | ........... | H01L 23/3732 |
| | | | | 257/706 |
| 2005/0270741 A1* | 12/2005 | Wang | .................. | H01L 23/4006 |
| | | | | 361/695 |
| 2007/0147002 A1* | 6/2007 | Otsuki | .................. | H01L 23/467 |
| | | | | 361/704 |
| 2007/0177355 A1* | 8/2007 | Ito | ....................... | H01L 23/3672 |
| | | | | 361/709 |
| 2008/0073069 A1* | 3/2008 | Wu | ..................... | H01L 21/4882 |
| | | | | 165/185 |
| 2008/0192427 A1* | 8/2008 | Wu | ...................... | H01L 23/427 |
| | | | | 361/679.52 |
| 2009/0027858 A1* | 1/2009 | Lai | ..................... | H01L 23/4093 |
| | | | | 361/709 |
| 2009/0034204 A1* | 2/2009 | Wayman | ............... | H01L 23/3677 |
| | | | | 361/709 |
| 2010/0232108 A1* | 9/2010 | Chuang | ................. | H01L 23/467 |
| | | | | 361/697 |
| 2010/0263850 A1* | 10/2010 | Huang | ............... | H01L 23/3672 |
| | | | | 165/185 |
| 2010/0276114 A1* | 11/2010 | Peeters | ..................... | A61F 7/00 |
| | | | | 165/11.1 |
| 2011/0267771 A1* | 11/2011 | Cheng | ....................... | G06F 1/20 |
| | | | | 361/679.54 |
| 2011/0308776 A1* | 12/2011 | Huang | ............... | H01L 23/3672 |
| | | | | 165/121 |
| 2011/0315366 A1* | 12/2011 | Chen | .................... | B21D 53/085 |
| | | | | 165/185 |
| 2012/0018137 A1* | 1/2012 | Chang | ................. | F28D 15/0233 |
| | | | | 165/185 |
| 2012/0126280 A1* | 5/2012 | Lee | ....................... | H01L 33/642 |
| | | | | 257/99 |
| 2012/0126387 A1* | 5/2012 | Fishley | ............... | H01L 23/3128 |
| | | | | 257/690 |
| 2012/0145374 A1* | 6/2012 | Chen | .................. | H01L 23/3672 |
| | | | | 165/185 |
| 2012/0318481 A1* | 12/2012 | Yuan | ........................ | G06F 1/20 |
| | | | | 165/104.26 |
| 2013/0048251 A1* | 2/2013 | Xiao | ..................... | F28D 15/046 |
| | | | | 165/104.26 |
| 2013/0105132 A1* | 5/2013 | Huang | ................. | F28D 15/0275 |
| | | | | 165/185 |
| 2013/0299154 A1* | 11/2013 | Lin | ...................... | H01L 23/427 |
| | | | | 165/185 |
| 2015/0289357 A1* | 10/2015 | Wakana | .................. | H05K 1/181 |
| | | | | 174/535 |
| 2016/0284624 A1* | 9/2016 | Yamada | ............ | H01L 23/3675 |
| 2017/0110411 A1* | 4/2017 | Meyer, IV | ........... | H05K 7/2029 |
| 2018/0158755 A1* | 6/2018 | Ritter | .................. | H01L 23/4093 |
| 2019/0003775 A1* | 1/2019 | Lin | ........................ | H05K 7/209 |

\* cited by examiner

HEAT SINK AND HOUSING ASSEMBLY

CROSS-REFERENCE TO RELATED APPLICATION

This application claims the benefit of the filing date under 35 U.S.C. § 119(a)-(d) of Chinese Patent Application No. 201811165757.0, filed on Sep. 30, 2018.

FIELD OF THE INVENTION

The present invention relates to a heat sink and, more particularly, to a heat sink for an electronic device.

BACKGROUND

During operation of an electronic device, such as a high-speed electrical connector, the heat generated by the electronic device reduces electrical performance of the electronic device. A heat sink is mounted on a housing of the electronic device to reduce the temperature of the electronic device. When the heat sink is mounted on the housing, a part of the heat sink is generally fixed to the housing by a mounting frame to simplify the mounting operation.

The heat sink of the conventional high-speed electrical connector generally comprises machining parts, such as a fin, and a base arranged on a housing of the connector. The machining process requires a high manufacturing cost and impairs high-efficiency and mass production.

SUMMARY

A heat sink includes a heat sink body having a plurality of stacked fins and a mounting base including a heat dissipation plate. A first surface of the heat dissipation plate is connected to a lower portion of the heat sink body. A protrusion protruding away from the heat sink body is disposed on a portion of a second surface of the heat dissipation plate opposite to the first surface. The protrusion is formed by stamping or bending the heat dissipation plate away from the heat sink body from the first surface of the heat dissipation plate.

BRIEF DESCRIPTION OF THE DRAWINGS

The invention will now be described by way of example with reference to the accompanying Figures, of which.

DETAILED DESCRIPTION OF THE EMBODIMENT(S)

Although the present disclosure will be fully described with reference to the accompanying drawings including the embodiments of the disclosure, it should be understood that modifications may be made to the disclosure by those skilled in the art. The description is to be understood as a broad disclosure for those skilled in the art, and is not intended to be limited to the exemplary embodiments described herein.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
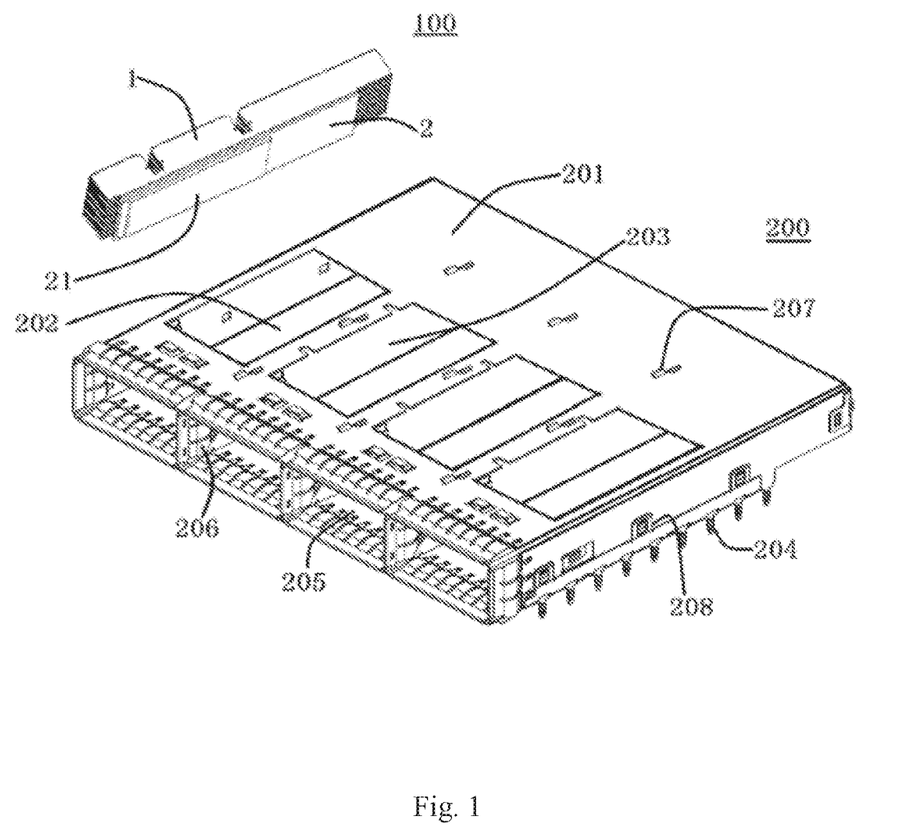
FIG. 1 is an exploded perspective view of a housing assembly according to an embodiment.

A housing assembly according to an embodiment, as shown in FIG. 1, comprises a housing 200 and a heat sink 100. In the shown embodiment, the housing 200 is made of a metal sheet.

The housing 200, as shown in FIG. 1, has a plurality of accommodating chambers 205 formed therein. In the shown embodiment, the housing 200 has four accommodating chambers 205. The four accommodating chambers 205 are adapted to accommodate four electronic modules (not shown), respectively. In other embodiments, the housing 200 may have one, two, three, five, or more accommodating chambers 205.

Each accommodating chamber 205, as shown in FIG. 1, has an opening 202 formed in a top wall 201 of the housing 200. The housing 200 has a generally cuboid shape and includes the top wall 201, a bottom wall, and a pair of side walls. A plurality of partition plates 203, three in the shown embodiment, are installed between the top wall 201 and the bottom wall to divide the interior of the housing 200 into four accommodating chambers 205 extending in a longitudinal direction. Electronic modules, which may generate heat during operation, for example, electronic device such as electrical connectors, CPUs, amplifiers; photoelectric converters; disk readers; and the like, may be accommodated in the accommodating chambers 205.

The heat sink 100, as shown in FIGS. 1-5, includes a heat sink body 1 and a mounting base. The heat sink body 1 has a plurality of stacked fins 11, for example, made of aluminum. The thickness of each fin 11 is about 0.2 mm, for example. The mounting base includes a heat dissipation plate 2. A first surface (top surface) of the heat dissipation plate 2 is connected to a lower portion of the heat sink body 1.

Figure 2:
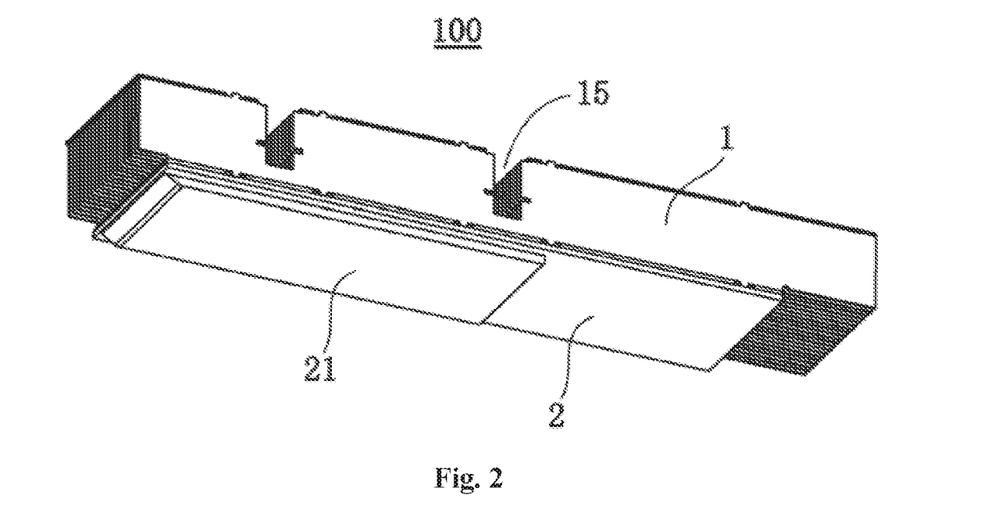
FIG. 2 is a perspective view of a heat sink according to an embodiment.
Figure 3:
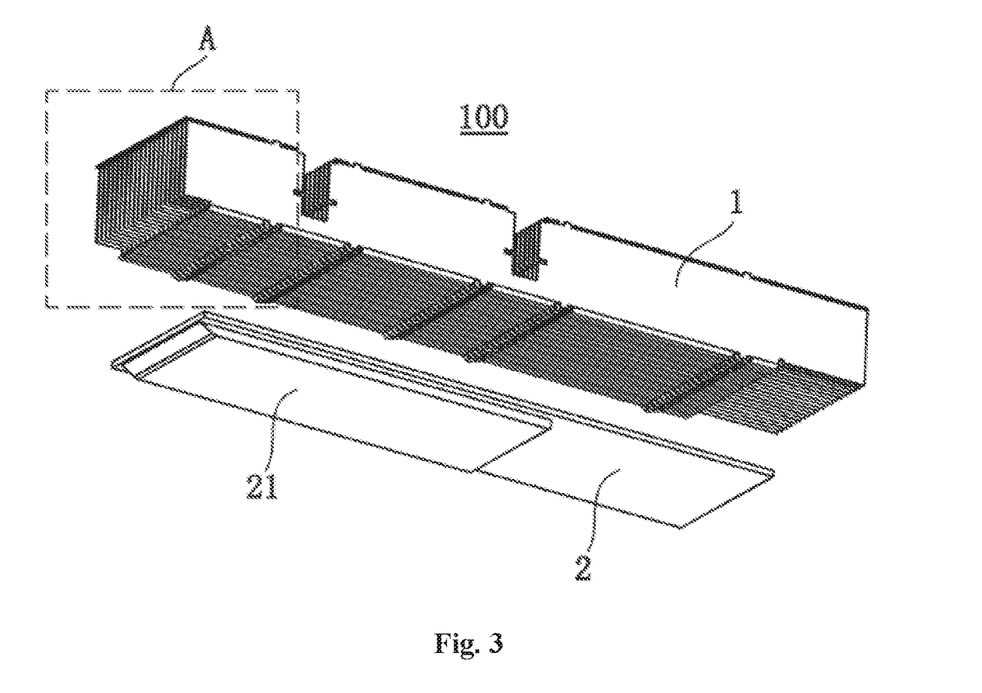
FIG. 3 is an exploded perspective view of the heat sink of FIG. 2.

As shown in FIGS. 1-3, a protrusion 21 protruding away from the heat sink body 1 is provided on a portion of a second surface of the heat dissipation plate 2 opposite to the first surface. The protrusion 21 is formed by stamping or bending the heat dissipation plate 2 away from the heat sink body 1 from the first surface of the heat dissipation plate 2. The protrusion 21 is adapted to contact the electronic module to transfer heat generated by the electronic module to the heat sink body 1, thereby dissipating the electronic module.

The heat sink 100 is mounted on the top wall 201 of the housing 200, a portion of a bottom of the heat sink 100 is located outside the accommodating chamber 205, and the protrusion 21 of each heat sink 100 extends through the opening 203 to be in contact with the electronic module accommodated in the accommodating chamber 205.

Figure 5:
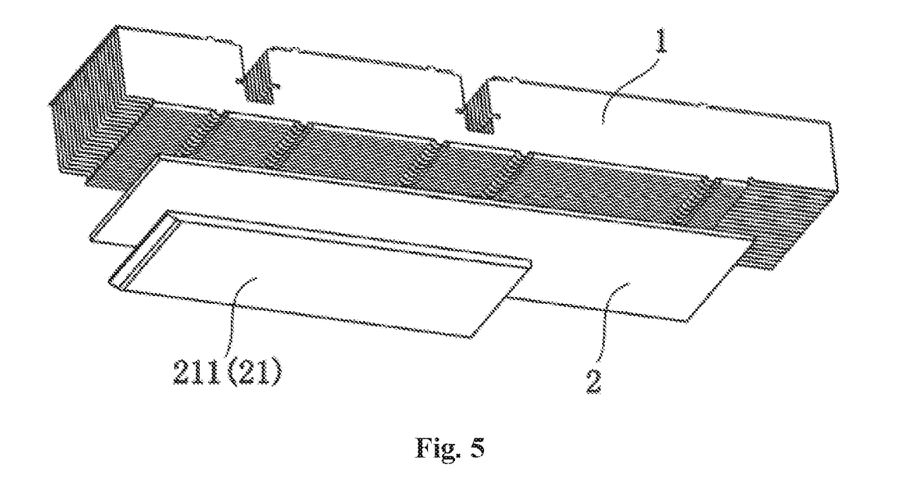
FIG. 5 is an exploded perspective view of the heat sink of FIG. 2.

The mounting base, as shown in FIG. 5, includes a secondary heat dissipation plate 211 having an area smaller than that of the heat dissipation plate 2 and mounted on the second surface of the heat dissipation plate 2 to form the protrusion 21. In this embodiment, the mounting base includes the heat dissipation plate 2 and the secondary heat dissipation plate 211. Because the secondary heat dissipation plate 211 is fixed on the second surface of the heat dissipation plate 2, the top surface (first surface) of the heat dissipation plate 2 may be flat. In this way, the bottom surface of the heat sink body 1 has a large flat portion, thereby facilitating the fabrication of the heat sink body 1.

Figure 6:
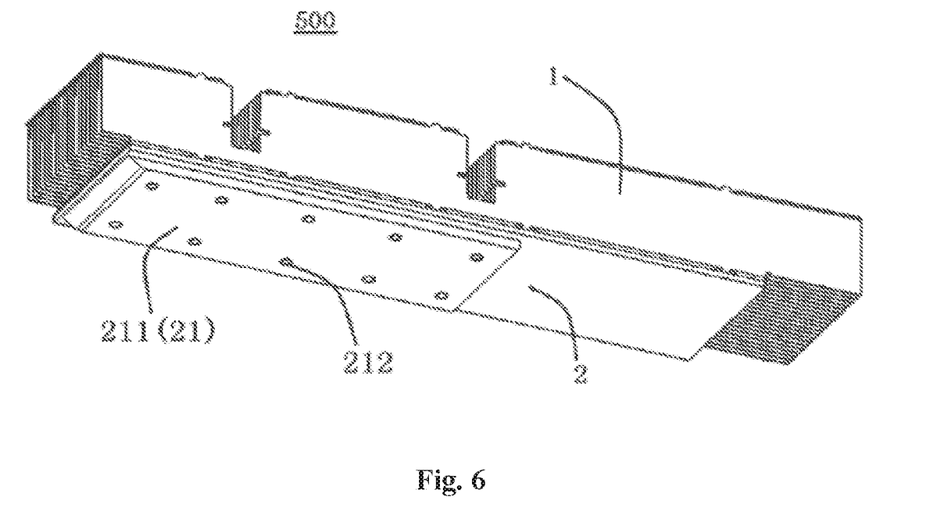
FIG. 6 is a perspective view of a heat sink according to another embodiment.

In the embodiment shown in FIG. 5, the secondary heat dissipation plate 211 is fixed to the heat dissipation plate 2 by welding. In the heat sink 500 of an alternative embodiment shown in FIG. 6, the secondary heat dissipation plate 211 is fixed to the heat dissipation plate 2 by rivets 212. Different numbers of secondary heat dissipation plates 211 may be provided and stacked together according to the height of the protrusion 21 to be formed.

Figure 7:
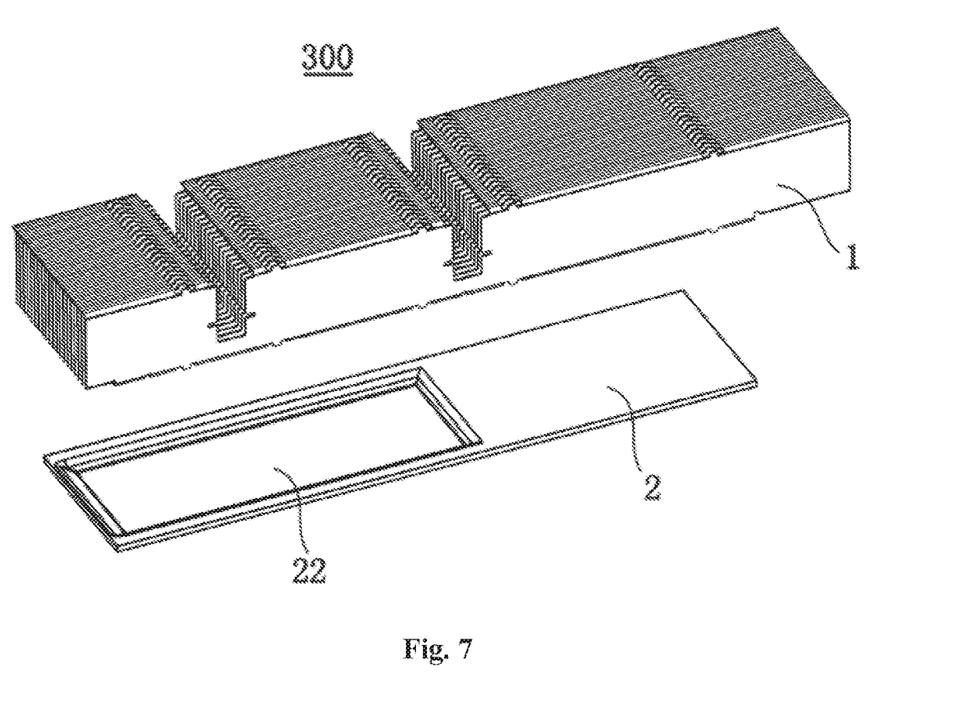
FIG. 7 is an exploded top perspective view of a heat sink according to another embodiment.
Figure 8:
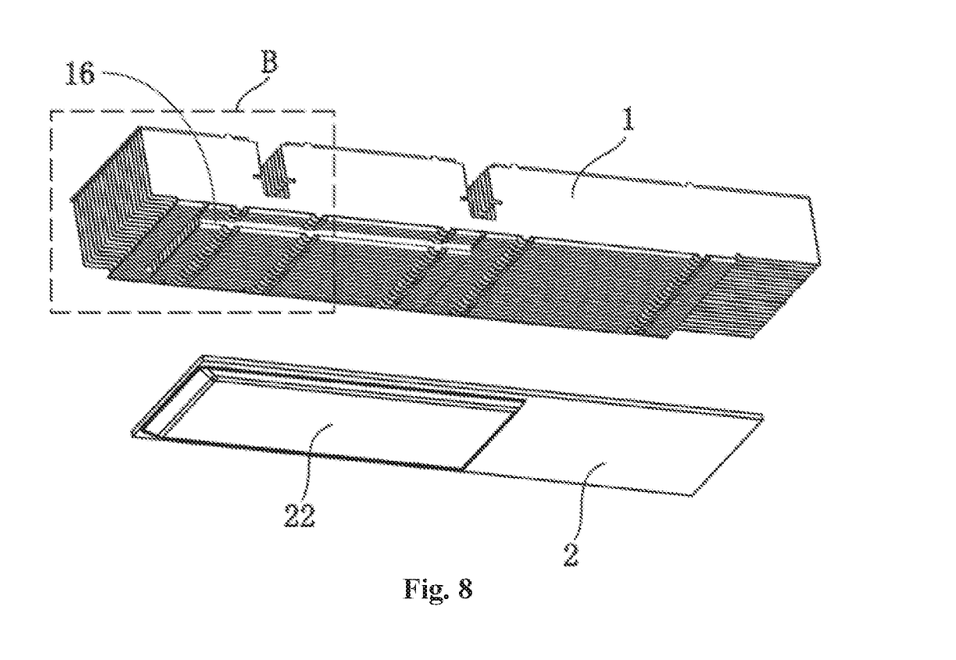
FIG. 8 is an exploded bottom perspective view of the heat sink of FIG. 7.
Figure 9:
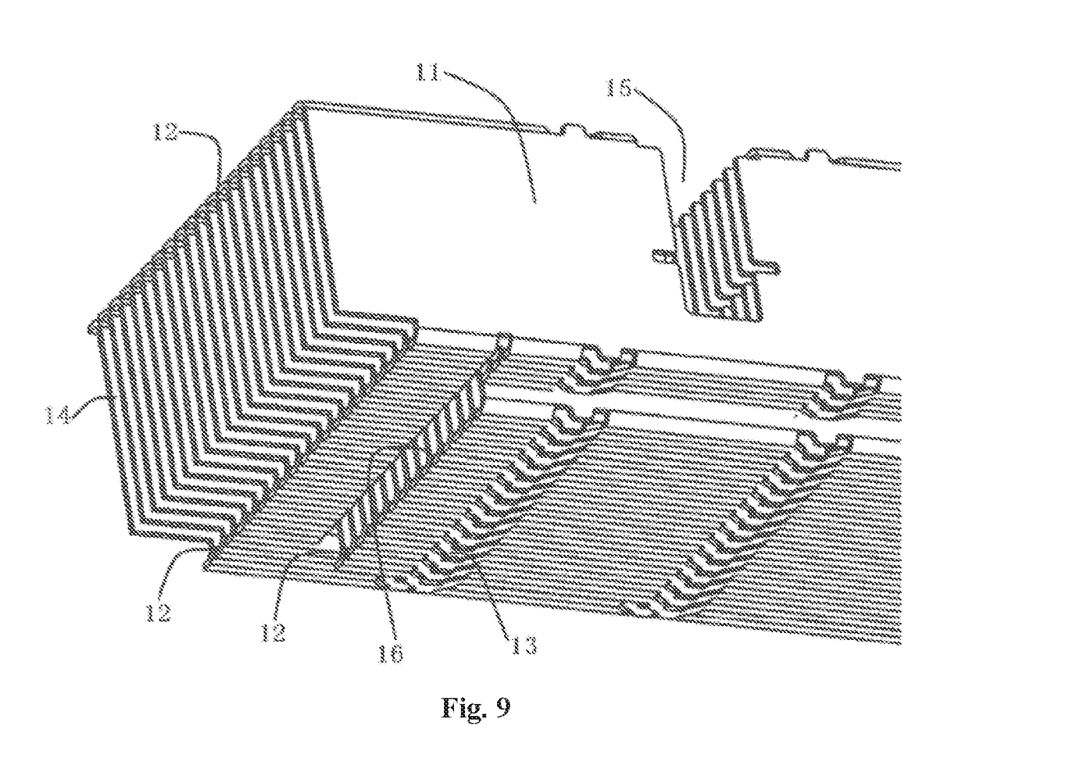
FIG. 9 is an enlarged perspective view of a portion B of FIG. 8.
Figure 10:
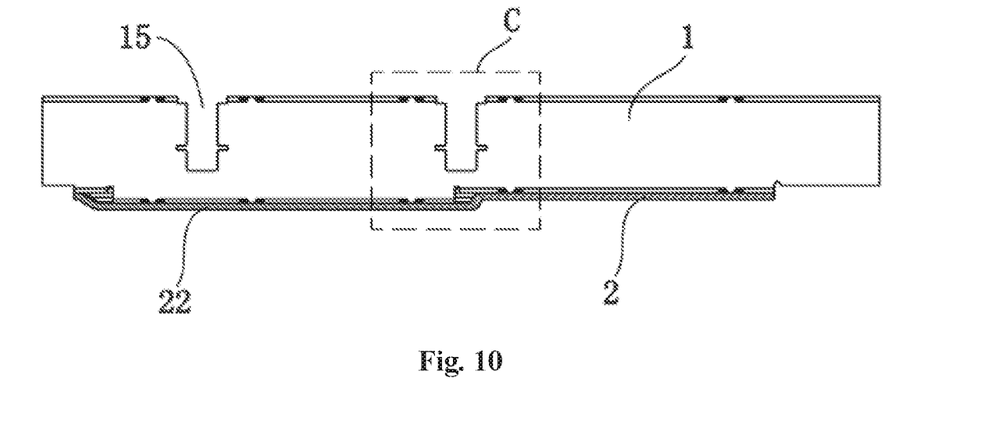
FIG. 10 is a side view of the heat sink of FIG. 7.
Figure 11:
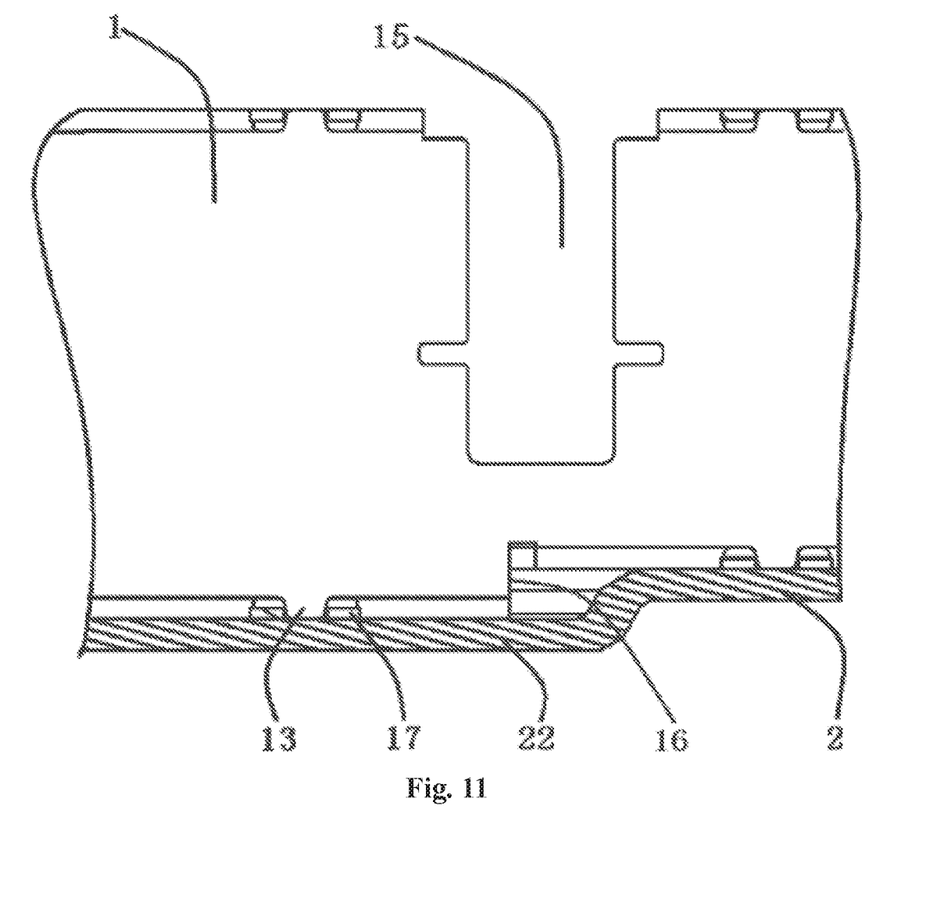
FIG. 11 is an enlarged side view of a portion C of FIG. 10.

In a heat sink 300 according to another embodiment, as shown in FIGS. 7-11, a protrusion 22 is formed by stamping the heat dissipation plate 2 away from the heat sink body 1 from the first surface of the heat dissipation plate 2. After the stamping process, as shown in FIG. 7, a depression is formed on the first surface of the heat dissipation plate 2. Accordingly, as shown in FIGS. 8 and 9, the lower portion of the heat sink body 1 has a boss 16 protruding downward. The boss 16 is engaged with an inner side of the protrusion 22 or depression, as shown in FIGS. 10 and 11, and the lower portion of the heat sink body 1 is thereby sufficiently brought into contact with the protrusion 22, ensuring the heat radiation effect.

Figure 12:
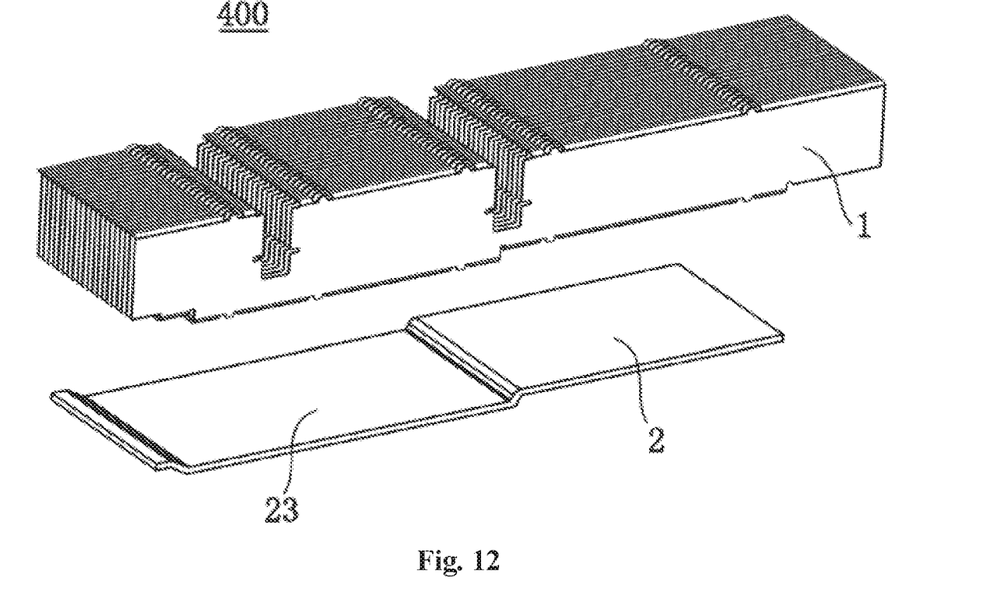
FIG. 12 is an exploded top perspective view of a heat sink according to another embodiment.
Figure 13:
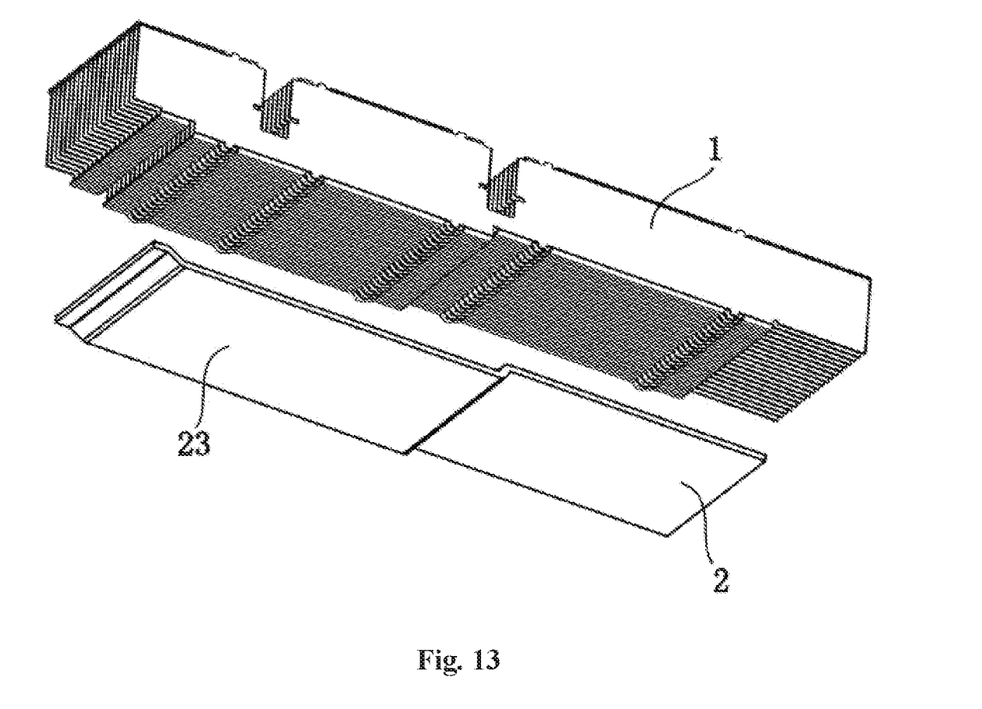
FIG. 13 is an exploded bottom perspective view of the heat sink of FIG. 12.
Figure 14:
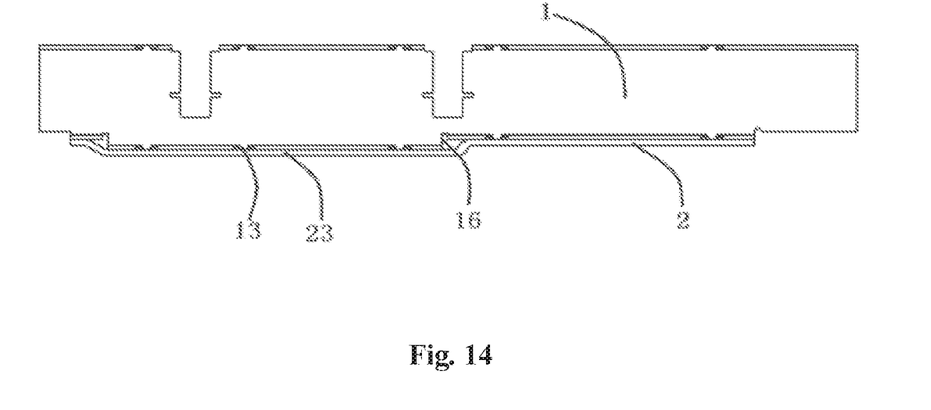
FIG. 14 is a side view of the heat sink of FIG. 12.

In a heat sink 400 according to another embodiment, as shown in FIGS. 12-14, a protrusion 23 is formed by bending a portion of the heat dissipation plate 2 a plurality of times, so that the protrusion 23 forms an arch bridge structure with respect to a main body of the heat dissipation plate 2. Accordingly, as shown in FIG. 9, the lower portion of the heat sink body 1 has a boss 16 protruding downward. The boss 16, as shown in FIG. 14, is engaged with the inner side of the protrusion 23, and the lower portion of the heat sink body 1 is thereby sufficiently brought into contact with the protrusion 23, ensuring the heat radiation effect. The structure of the heat sink body 1 of the heat sink 300 shown in FIG. 7 is the same as that of the heat sink body 1 of the heat sink 400 shown in FIG. 12.

In the heat sink 100, 300, 400 or 500 of the above embodiments, as shown in FIGS. 1, 2, 9, and 11, the heat sink body 1 has a plurality of grooves 15 for accommodating fixing members. A plurality of fixing protrusions 208 are formed on the side walls of the housing 200, as shown in FIG. 1, and the heat sink 100, 300, 400 or 500 may be mounted to the housing 200 by a generally arcuate-shaped fixing member passing through the grooves 15 and snap-fitted with the fixing protrusions 208.

Figure 4:
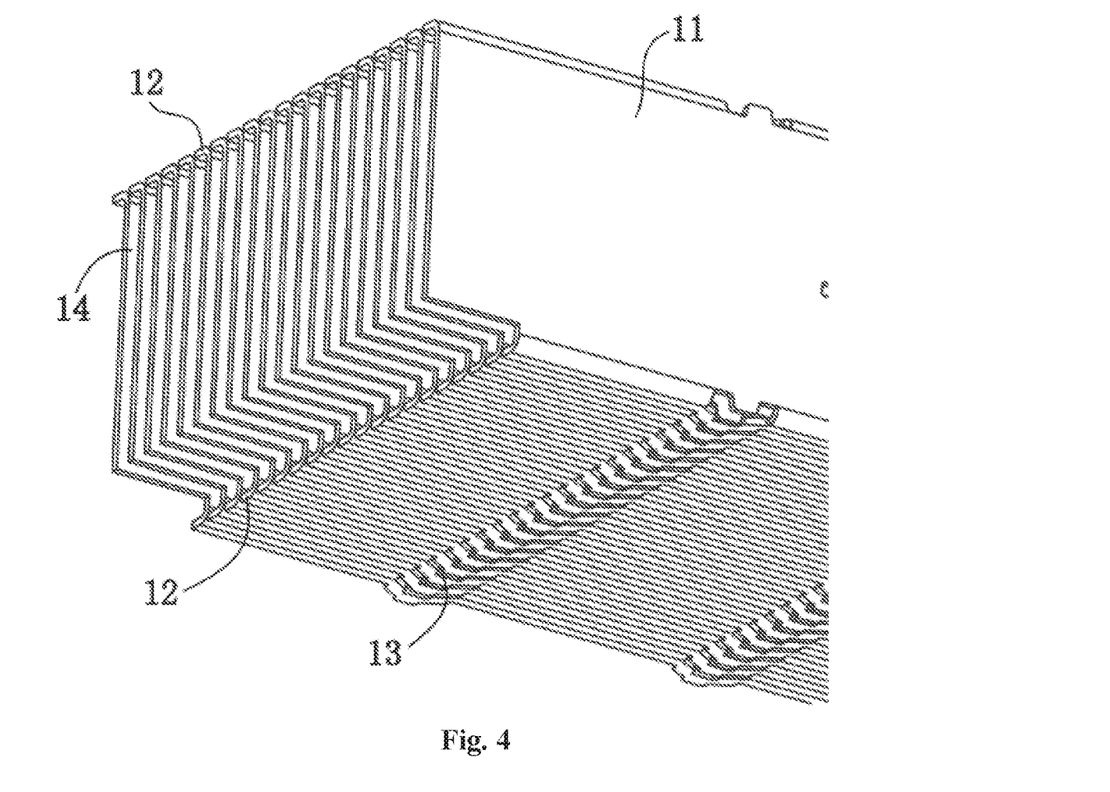
FIG. 4 is an enlarged perspective view of a portion A of FIG. 3.

As shown in FIGS. 4 and 9, in an embodiment, at least one of the upper and lower edges of each fin 11 has a folded edge 12, and the plurality of fins 11 are connected in sequence by the plurality of folded edges 12. For example, a lamination process may be performed such that the plurality of fins 11 are connected in sequence by the plurality of folded edges 12, and a ventilation channel 14 is formed between two adjacent fins 11. Both the heat dissipation plate 2 and the secondary heat dissipation plate 211 may be made of aluminum, aluminum alloy, or copper sheet to improve the heat dissipation effect.

As shown in FIGS. 4, 9, 11 and 14, the lower edge of each fin 11 has a tab 13 extending downward, and the tabs 13 of the plurality of fins 11 are arranged in a row so as to form a protrusion extending in a lateral direction of the heat sink body 1. A welding operation may be performed at each tab 13 to fix the heat sink 1 to the heat dissipation plate 2.

Each partition plate 203, as shown in FIG. 1, has at least one positioning portion 207 extending out of the top wall 201 and the bottom wall of the housing 200. The positioning portion 207 is bent after passing through the top wall 201 and the bottom wall to fix the partition plate 203.

As shown in FIG. 1, in the case where the electronic module is an electrical connector, the housing 200 has a generally cuboid shape, and the front portion of the housing 200 has a plurality of openings for receiving mating electrical connectors, respectively. The edges of the opening have an elastic electromagnetic shielding sheet 206 for increasing the electromagnetic shielding performance between the housing 200 and the electronic module. The lower portion of the housing 200 has a plurality of pins 204 for mounting to a mounting device such as a circuit board.

It will be understood by those skilled in the art that the above-described embodiments are exemplary and that modifications may be made by those skilled in the art. Structures described in the various embodiments may be freely combined without conflict in structure or principle, thereby implementing a wider variety of heat sinks and housing assemblies while solving the technical problems of the present disclosure.

Although the embodiments of the present disclosure have been described in detail, it will be apparent to those skilled in the art that various changes and modifications can be made without departing from the scope and spirit of the appended claims, and the disclosure is not limited to the exemplary embodiments illustrated in the specification.

What is claimed is:

1. A heat sink, comprising:
   a heat sink body having a plurality of stacked fins defining a downwardly protruding boss; and
   a mounting base including a heat dissipation plate, a first surface of the heat dissipation plate is connected to a lower portion of the heat sink body, a protrusion protruding away from the heat sink body is disposed on a portion of a second surface of the heat dissipation plate opposite to the first surface, the protrusion is formed by stamping or bending the heat dissipation plate away from the heat sink body from the first surface of the heat dissipation plate, the protrusion forming a corresponding depression in the first surface of the heat dissipation plate receiving the boss of the heat sink body.

2. The heat sink of claim 1, wherein the protrusion is formed by stamping the heat dissipation plate away from the heat sink body from the first surface of the heat dissipation plate.

3. The heat sink of claim 1, wherein the protrusion is formed by bending the heat dissipation plate a plurality of times.

4. The heat sink of claim 3, wherein the depression is open on its lateral sides exposing corresponding lateral sides of the boss.

5. The heat sink of claim 1, wherein the heat sink body has a groove adapted to receive a fixing member.

6. The heat sink of claim 1, wherein at least one of an upper edge and a lower edge of each fin has a folded edge.

7. The heat sink of claim 6, wherein the plurality of fins are connected in sequence by the folded edges.

8. The heat sink of claim 6, wherein the lower edge of each fin has a tab extending downward.

9. The heat sink of claim 8, wherein the tabs of the fins are arranged in a row.

10. The heat sink of claim 9, wherein the tabs are welded to the heat dissipation plate.

11. The heat sink of claim 6, wherein the upper edge and the lower edge of each of the stacked fins is folded and the fins are connected in sequence by the folded upper and lower edges.

12. The heat sink of claim 11, wherein the folded upper edges of each of the stacked fins are laminated together forming a ventilation channel between each pair of adjacent fins.

13. The heat sink of claim 11, wherein the folded upper edges of each stacked fin extend further in at least one length direction of the heat sink body than the folded lower edges of each stacked fin.

14. The heat sink of claim 1, wherein the heat dissipation plate is made of an aluminum or an aluminum alloy material.

15. The heat sink of claim 1, wherein the boss includes a plurality of downwardly extending ends of the plurality of stacked fins, each of the ends of the stacked fins defining the boss being received within the depression.

16. The heat sink of claim 15, wherein the lower edge of each of the stacked fins defining the boss is folded.

17. The heat sink of claim 15, wherein the boss extends across an entire width of the heat sink body.

18. The heat sink of claim 15, wherein the boss extends across only a portion of a width of the heat sink body.

19. The heat sink of claim 15, wherein at least one tab is formed on each end of the stacked fins defining the boss.

20. A housing assembly, comprising:

a housing having an accommodating chamber adapted to receive an electronic module, the accommodating chamber having an opening in a top wall of the housing; and a heat sink disposed on the top wall and including a heat sink body having a plurality of stacked fins, the heat sink body defining a protruding boss including a plurality of downwardly extending ends of the plurality of stacked fins, and a mounting base including a heat dissipation plate, a first surface of the heat dissipation plate is connected to a lower portion of the heat sink body, a protrusion protruding away from the heat sink body is disposed on a portion of a second surface of the heat dissipation plate opposite to the first surface, the protrusion is formed by stamping or bending the heat dissipation plate away from the heat sink body from the first surface of the heat dissipation plate, the protrusion forming a corresponding depression in the first surface of the heat dissipation plate receiving the boss of the heat sink body, the protrusion extends through the opening in the top wall and is in contact with the electronic module in the accommodating chamber.

* * * * *